United States Patent [19]

Duncan

[11] Patent Number: 5,293,996
[45] Date of Patent: Mar. 15, 1994

[54] CONTAINER HAVING AN OBSERVATION WINDOW

[75] Inventor: William V. Duncan, Scottsdale, Ariz.

[73] Assignee: Motorola, Inc., Schaumburg, Ill.

[21] Appl. No.: 883,323

[22] Filed: May 14, 1992

[51] Int. Cl.$^5$ ............................................. B65D 73/00
[52] U.S. Cl. .................................. 206/459.1; 206/204; 206/328; 206/524.4
[58] Field of Search ............... 206/204, 328, 332, 334, 206/459.1, 524.4

[56] References Cited

U.S. PATENT DOCUMENTS

| | | | |
|---|---|---|---|
| 2,446,361 | 8/1948 | Clibbon | 206/459.1 |
| 2,459,400 | 1/1949 | Williams | 206/459.1 |
| 4,091,921 | 5/1978 | Lewis | 206/459.1 |
| 4,098,577 | 7/1978 | Halpern | 206/459.1 |
| 4,206,844 | 6/1980 | Thukamoto et al. | 206/459.1 |
| 4,528,222 | 7/1985 | Rzepecki et al. | 206/328 |
| 4,529,087 | 7/1985 | Neal et al. | 206/328 |
| 4,579,223 | 4/1986 | Otsuka et al. | 206/204 |
| 4,681,218 | 7/1987 | Williams | 206/204 |
| 4,753,352 | 6/1988 | Dauphin et al. | 206/204 |
| 4,813,791 | 3/1989 | Cullen et al. | 206/204 |
| 4,861,632 | 8/1989 | Caggiano | 206/204 |
| 4,923,059 | 5/1990 | Evers et al. | 206/204 |
| 4,969,750 | 11/1990 | Russo et al. | 206/524.4 |
| 4,971,196 | 11/1990 | Kitamura et al. | 206/328 |
| 5,043,195 | 8/1991 | Skrivseth | 206/328 |

FOREIGN PATENT DOCUMENTS 1-09883  4/1990  Japan ................................. 206/328

*Primary Examiner*—David T. Fidei
*Attorney, Agent, or Firm*—Joe E. Barbee; Rennie William Dover

[57] ABSTRACT

A sealed container (10) having a plurality of compartments. A first compartment (11) has a window (15) with a transparent panel. A humidity indicator device (16) is placed within the first compartment (11). A second compartment (12) is coupled to the first compartment (11) by a plurality of environmental exchange channels (17). At least one article (27), such as plastic encapsulated electronic components, is stored in the second compartment (12). A third compartment (13) is coupled to the second compartment (12) by a plurality of moisture transport channels (20). A desiccant (31) is placed in the third compartment (13). An internal environment of the sealed container (10) is monitored by viewing the humidity indicator device (16) through the window (15).

12 Claims, 2 Drawing Sheets

CONTAINER HAVING AN OBSERVATION WINDOW

BACKGROUND OF THE INVENTION

This invention relates, in general, to containers, including, but not limited to, containers capable of serving as moisture barriers, providing electro-static discharge protection, and having an internal environmental monitor.

Typically, semiconductor manufacturers store and ship plastic encapsulated electronic components within a sealed container. The sealed container provides, among other things, a low moisture environment and electro-static discharge (ESD) protection for the plastic encapsulated electronic components. Moisture present within the sealed container may be absorbed by the plastic encapsulating material. Subsequent high temperature operations such as surface mounting of the plastic encapsulated electronic components, may vaporize the absorbed moisture thereby generating a tremendous pressure within the plastic encapsulating material. The pressure may crack the plastic encapsulating material and result in failure of the encapsulated electronic component.

In addition to the plastic encapsulated electronic components, a desiccant and a humidity indicator are typically enclosed within the sealed container. The desiccant absorbs any moisture trapped within the sealed container during the sealing operation. The humidity indicator provides a visual display of the amount of moisture present within the sealed container. The sealed container must be opened in order to inspect the encapsulated humidity indicator. If the humidity indicator indicates that the sealed container had a humidity level within an acceptable level, the plastic encapsulated electronic components, a new desiccant, and a new humidity indicator are sealed inside another container. Thus, unsealing the container to inspect the humidity indicator adds considerable expense to the storage and shipping of plastic encapsulated electronic components. Accordingly, it would be advantageous to have a low cost means for monitoring the internal environment of a sealed container without unsealing the container.

SUMMARY OF THE INVENTION

Briefly stated, the present invention provides a container capable of providing a moisture barrier and electro-static discharge protection for articles stored within the container. The container includes an environmental monitoring chamber having a transparent window. An environmental monitoring means is placed within the environmental monitoring chamber. An internal environment of the container is monitored by viewing the environmental monitoring means through the window.

DETAILED DESCRIPTION OF THE DRAWINGS

Figure 1:
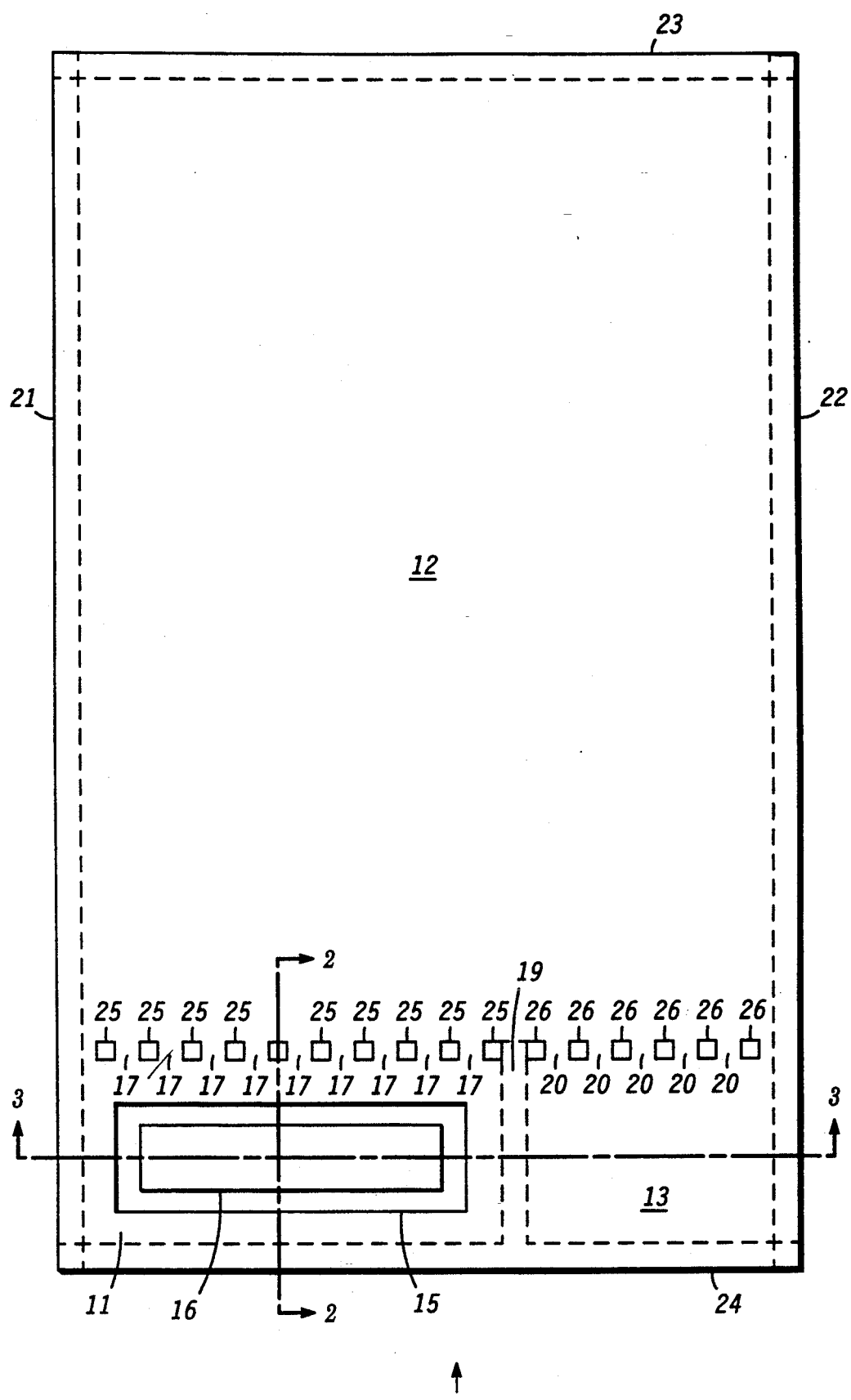
FIG. 1 illustrates an enlarged plan view of a portion of a sealed container in accordance with the present invention.

FIG. 1 illustrates an enlarged plan view of a portion of a sealed container 10 in accordance with the present invention. Sealed container 10 serves as a moisture barrier and provides electro-static discharge (ESD) protection. In a first embodiment, sealed container 10 has a first compartment 11, a second compartment 12, and a third compartment 13. First compartment 11 has a transparent window 15 which permits visual inspection of an interior portion of first compartment 11. Window 15 includes an opening having transparent panel which also serves as a barrier to moisture and provides ESD protection. Window 15 functions as an observation window. The transparent panel may be any suitable material; for example, FR-7750 manufactured by Cryovac. Further, first compartment 11 houses a humidity indicator device 16. Humidity indicator device 16 may be, for example, an HF-HI indicator manufactured by Humidial Corp. It shall be understood that the type of material for the transparent panel and the type of humidity indicator device 16 are merely offered as examples and are not limitations of the present invention.

First compartment 11 is coupled to second compartment 12 by a first plurality of channels 17 which serve as environmental exchange channels. Environmental exchange channels 17 permit an ambient environment of second compartment 12 to enter first compartment 11, and thereby interact with humidity indicator device 16. First compartment 11 is separated from third compartment 13 by a barrier 19, indicated by dashed lines. First compartment 11 is also referred to as an environmental monitoring chamber.

Second compartment 12 is adjacent to first compartment 11 and third compartment 13. A second plurality of channels 20 couple second compartment 12 with third compartment 13. Second plurality of channels 20 serve as moisture transport channels. Second compartment 12 is for storing at least one plastic encapsulated electronic component (not shown). Second compartment 12 is also referred to as an article storage chamber.

Third compartment 13, coupled to second compartment 12 may house a desiccant (not shown). The desiccant may be, for example, a desiccant sold under the trademark "DESI PAK", and manufactured by United Desiccants-Gates. Third compartment 13 is also referred to as a moisture absorber storage chamber.

Preferably, sealed container 10 comprises a top sheet having a first edge 21, a second edge 22, a third edge 23, a fourth edge 24, and a bottom sheet of similar dimensions as the top sheet and having edges corresponding to those of the top sheet. Only the top sheet is visible in FIG. 1. Further, the top sheet includes transparent window 15. The top and bottom sheets may be, for example, a multi-layer structure comprising a layer of polyethylene, a layer of aluminum, and a layer of terephtalate polyethylene. It shall be understood that other materials for the top and bottom sheets having sufficient moisture barrier and ESD protection properties may be used. Materials having these properties are well known to those skilled in the art.

Sealed container 10 is formed by bonding first edge 21 and second edge 22 of the top sheet with the corresponding edges of the bottom sheet as indicated by dashed lines adjacent to first and second edges 21 and 22, respectively. Environmental exchange channels 17 may be formed by bonding a plurality of discrete portions of the top sheet with the corresponding discrete portions of the bottom sheet as shown by bonds 25. Environmental exchange channels 17 are interdigitated with bonds 25. Barrier 19 is formed by bonding a strip of the top sheet with a corresponding strip on the bottom sheet. In the first embodiment, barrier 19, a portion of first edge 21, and bonds 25 form environmental monitoring chamber 11.

Moisture transport channels 20 may be formed by bonding a plurality of discrete portions of the top sheet with the corresponding discrete portions of the bottom sheet as shown by bonds 26. Moisture transport channels 20 are interdigitated with bonds 26. In the preferred embodiment, barrier 19, a portion of second edge 22, and bonds 26 form moisture absorber storage chamber 13.

An article, such as a plastic encapsulated electronic component, is placed in article storage chamber 12. Third edge 23 of the top sheet is bonded with the corresponding edge of the second sheet, thereby sealing article storage chamber 12 as indicated by dashed lines adjacent to third edge 21. A humidity indicator device 16 is placed within environmental monitoring chamber 11 and the desiccant (not shown) is placed within moisture absorber storage chamber 13. An ambient environment is evacuated from chambers 11, 12, and 13. Fourth edge 24 of the top sheet is bonded to the corresponding edge of the bottom sheet, thereby forming sealed container 10.

It shall be understood that the first embodiment is not a limitation of the present invention. In a second embodiment, window 15 may be located in a central portion of the top sheet. Further, a number of compartments may be lower or higher than the three compartments described in the first embodiment.

In a third embodiment, there may be two compartments: an article storage chamber 12 and an environmental monitoring chamber 11, wherein an article (not shown) is stored in article storage chamber 12, and a humidity indicator device 16 is stored in environmental monitoring chamber 12. In a fourth embodiment, humidity indicator device 16 and the desiccant (not shown) may be stored in environmental monitoring chamber 11, and the article is stored in article storage chamber 12. Moreover, the desiccant may be unnecessary, and therefore not used.

In a fifth embodiment, sealed container 10 having window 15 may be formed from a single sheet of material capable of serving as a moisture barrier and providing electro-static discharge protection.

Figure 2:
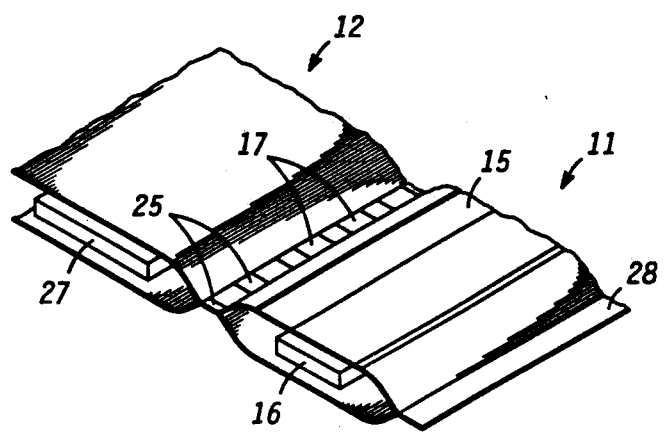
FIG. 2 illustrates a highly enlarged cross-sectional perspective view through section 2—2 of FIG. 1.

FIG. 2 illustrates a cross-sectional perspective view through cross-section 2—2 of FIG. 1. FIG. 2 shows environmental monitoring chamber 11, having window 15, housing humidity indicator device 16. A sealed portion 28 is formed by bonding the fourth edge 24 of the top sheet (FIG. 1) to the corresponding edge of the bottom sheet. Bonds 25 are interdigitated with environmental exchange channels 17. In order to enhance a clarity of FIG. 2, not all environmental exchange channels 17 and bonds 25 are labelled. A cross-sectional view of one bond 25 shows bond 25 isolating environmental exchange chamber 11 and article storage chamber 12. An article 27 is stored within article storage chamber 12.

Figure 3:
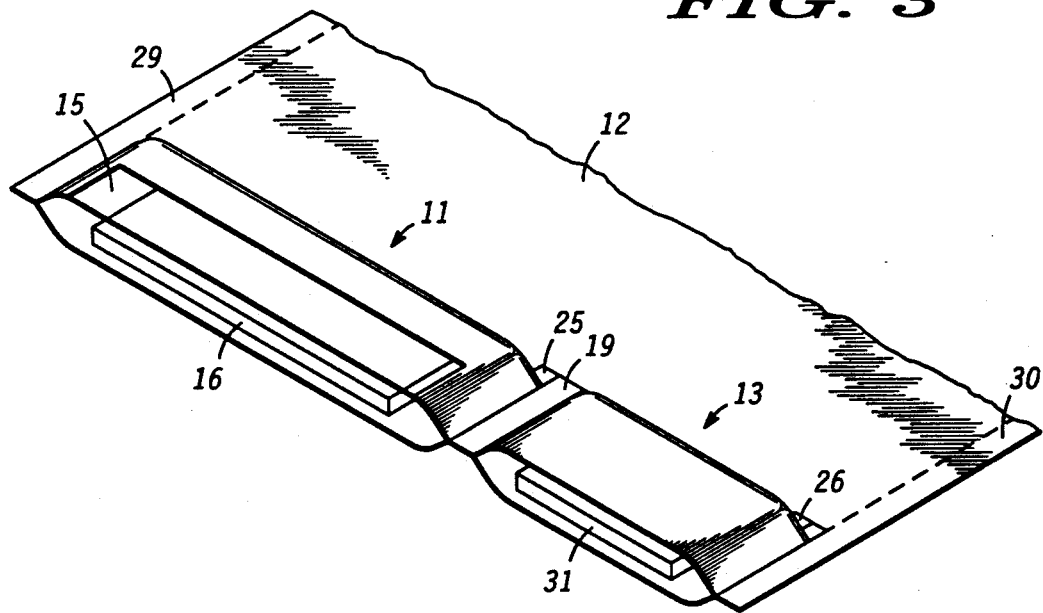
FIG. 3 illustrates a highly enlarged cross-sectional perspective view through section 3—3 of FIG. 1.

FIG. 3 illustrates a cross-sectional perspective view through cross-section 3—3 of FIG. 1. FIG. 3 shows environmental monitoring chamber 11, having window 15 and housing humidity indicator device 16. Environmental monitoring chamber 11 is coupled to article storage chamber 12 by environmental exchange channels 17 (not shown). Although only a single bond 25 is shown in FIG. 3, it shall be understood that a plurality of environmental exchange channels 17 (as shown in FIG. 1) are interdigitated with a plurality of bonds 25 as presented in the discussion of FIG. 1. Further, moisture absorber storage chamber 13 houses a desiccant 31. Moisture transport channels 20 couple moisture absorber storage chamber 13 to article storage chamber 12. Although only a single bond 26 is shown in FIG. 3, it shall be understood that a plurality of moisture transport channels 20 are interdigitated with a plurality of bonds 26.

A sealed portion 29 is formed by bonding the first edge 21 (shown in FIG. 1) of the top sheet to the corresponding edge of the bottom sheet. A sealed portion 30 is formed by bonding the second edge 22 (shown in FIG. 1) of the top sheet to the corresponding edge of the bottom sheet. Dashed lines adjacent to sealed portions 29 and 30 merely indicate a width of sealed portions 29 and 30. Environmental monitoring chamber 11 is isolated from moisture absorber storage chamber 13 by barrier 19.

By now it should be appreciated that there has been provided an improved method for monitoring environmental conditions within a sealed container. The sealed container serves as a moisture barrier and provides electro-static discharge protection for articles stored within the container. The sealed container has a plurality of compartments wherein one of the compartments includes a window having a transparent panel. An environmental monitor is placed in the compartment having the sealed container.

Prior art techniques require opening the sealed container in order to determine the condition of the internal environment. If, for example, the moisture levels of the internal environment were within acceptable levels, the contents of the container were re-sealed using new container material, a new desiccant and a new humidity indicator device. Thus, eliminating the requirement for opening the sealed container, eliminates needless waste of materials, and decreases the cost of storing articles within the sealed container.

I claim:

1. A container having an observation window, wherein the container serves as a barrier to moisture and provides electro-static discharge protection, comprising:

a container, the container comprised of a top sheet and a bottom sheet, wherein at least a first compartment and a second compartment are between the top sheet and the bottom sheet;

a plurality of channels coupling the first compartment with the second compartment;

a plurality of bonds interdigitated with the plurality of channels, wherein the plurality of bonds are comprised of a plurality of discrete portions of the top sheet bonded with corresponding discrete portions of the bottom sheet;

an observation window, wherein the observation window exposes a portion of an interior of the first compartment; and a moisture level monitoring material within the first compartment, the moisture level monitoring material being visible through the observation window.

2. The container having an observation window of claim 1, wherein a moisture absorption material is placed within the container.

3. The container having an observation window of claim 1, wherein the container has a third compartment coupled to the second compartment by another plurality of channels.

4. The container having an observation window of claim 3, wherein the container houses a moisture absorption material in at least one of the three compartments.

5. An electro-static discharge protected container capable of preventing an ingress of moisture to an interior portion of the electro-static discharge protected container and capable of displaying moisture levels in the interior portion, comprising:

an electro-static discharge protected container, wherein the electro-static discharge protected container is comprised of a top sheet and a bottom sheet, and has at least an article storage chamber and an environmental monitoring chamber between the top sheet and the bottom sheet;

an environmental monitoring material in the environmental monitoring chamber;

a plurality of channels linking the environmental monitoring chamber and the article storage chamber, wherein a plurality of bonds are interdigitated with the plurality of channels, the plurality of bonds comprised of a plurality of discrete portions of the top sheet bonded with corresponding discrete portions of the bottom sheet; and a window, wherein the window enables visual inspection of an interior portion of the environmental monitoring chamber.

6. The electro-static discharge protected container of claim 5 wherein the article storage chamber houses an electronic device in a plastic package.

7. The electro-static discharge protected container of claim 5 wherein the electro-static discharge protected container includes a moisture absorption material storage chamber, the moisture absorption material storage chamber being linked to the article storage chamber by another plurality of channels.

8. The electro-static discharge protected container of claim 7, wherein the moisture absorption material storage chamber houses a moisture absorption material.

9. The container having an observation window of claim 1, wherein the top sheet and the bottom sheet are multi-layer structures comprised of a layer of polyethylene, a layer of aluminum, and a layer of terepthalate polyethylene.

10. The container having an observation window of claim 1, wherein the moisture level monitoring material monitors humidity levels.

11. The electro-static discharge protected container of claim 5, wherein the top sheet and the bottom sheet are multi-layer structures.

12. The electro-static discharge protected container of claim 11, wherein the top sheet and the bottom sheet are comprised of a layer of polyethylene, a layer of aluminum, and a layer of terepthalate polyethylene.

* * * * *